United States Patent [19]

Grochowski et al.

[11] Patent Number: 5,744,969
[45] Date of Patent: Apr. 28, 1998

[54] ANALOG AND MIXED SIGNAL DEVICE TESTER

[75] Inventors: Andrew Grochowski; Shwu-Liang Luke Hsieh, both of Allentown, Pa.

[73] Assignee: Lucent Technologies Inc., Murray Hill, N.J.

[21] Appl. No.: 581,283

[22] Filed: Dec. 29, 1995

[51] Int. Cl.$^6$ ................................................ G01R 20/26
[52] U.S. Cl. ........................... 324/614; 324/623; 324/626; 324/76.12; 324/77.11
[58] Field of Search ...................................... 324/623, 624, 324/620, 613, 614, 626, 76.12, 77.11

[56] References Cited

U.S. PATENT DOCUMENTS

| | | | |
|---|---|---|---|
| 3,567,872 | 3/1971 | Naryanan | 370/492 |
| 4,669,116 | 5/1987 | Agazzi | 379/411 |
| 4,993,047 | 2/1991 | Moffatt | 375/39 |

OTHER PUBLICATIONS

Tutorial DSP–Based Testing of Analog and Mixed–Signal Circuits Matthew Mahoney, IEEE Catalog Number Eh0258–4, pp. 61–111 Mar. 1987.

Adaptive Filter Theory, Simon Haykin, McMaster University, Prentice Hall, Englewood Cliffs, New Jersey 07632, Apr. 1986.

EDN, Jun. 1989, Chirp–z Transform Efficiently Computes Frequency Spectrum, T. Lyon.

IEEE Trans. of Circuits and Systems, Jul. 1987, Fundemental Relations between the LMS Algorithm and the DFT, B. Widrow.

IEEE Trans. on Automatic Control, Jul. 1965, A Consideration of the Discrete Volterra Series, P. Alper.

THD and SNR Tests Using the Simplified Volterra Series with Adaptive Algorithms, Luke S. L. Hsieh and Andrew Grochowski, AT&T Bell Laboratories, Allentown, PA, Jun. 1995.

IEICE Transactions on Fundamentals of Electronics, Communications and Computer Sciences, vol. E78–A, No. 1, Jan. 1995.

*Primary Examiner*—Ernest F. Karlsen
*Assistant Examiner*—Jose M. Solis
*Attorney, Agent, or Firm*—John T. Rehberg

[57] ABSTRACT

Analog and mixed signal integrated circuits are tested using the modified Volterra series to model the integrated circuit being tested. An adaptive algorithm, for example, least mean square or Kalman, is used to determine to coefficients of the Volterra series. The coefficients are then used to calculate the THD and SNR.

3 Claims, 1 Drawing Sheet

ANALOG AND MIXED SIGNAL DEVICE TESTER

TECHNICAL FIELD

This invention relates generally to apparatus and methods for testing integrated circuits and particularly to such apparatus and methods that are used for testing analog and mixed signal integrated circuits.

BACKGROUND OF THE INVENTION

Although more public attention is directed toward integrated circuit design and fabrication, including the performance characteristics, an essential, although less noticed, aspect of integrated circuit manufacture is testing of the manufactured integrated circuit. The physical testing of the product ultimately measures the actual performance of the integrated circuit, and determines if the integrated circuit is performing as it was designed to perform.

Although many tests could be performed, many analog and mixed signal integrated circuits require signal to noise ratio (SNR) and total harmonic distortion (THD) testing. A widely used testing method applies a single tone to the device under test (DUT). The output is digitized and transformed into the frequency domain using the fast Fourier transform (FFT). The least mean square algorithm is used to determine the coefficients of the Fourier transform. The SNR is the ratio of the power of the fundamental signal to the sum of the powers other than harmonics. The THD is the ratio of the power of the fundamental signal to the sum of the powers of the harmonic signals. See, for example IEEE Transaction on Circuits and Systems, CAS-34, pp. 814–820, July 1987 (which is incorporated by reference), for a description of the relationship between the discrete Fourier transform and the least mean square algorithm.

Although well adapted for many applications, testing using FFT does suffer from several drawbacks which will be briefly discussed. First, all data must be collected before any data can be processed. This precludes real time processing. Second, both the testing frequency and the sample rate must be carefully chosen so that the data points are independent of each other. The number of data points collected should be large so that computational errors are minimized. Third, the source and the digitizer must be synchronized to avoid smearing in the frequency domain. This prevents the use of a local oscillator for the digitizer which need not be connected to the master clock in the signal source.

SUMMARY OF THE INVENTION

According to an exemplary embodiment of this invention, apparatus for testing an integrated circuit having an analog circuit portion has signal generating means which is connected to a first summing node. An integrated circuit chip mounting means is electrically connected to the first summing node and to a second summing node. An adaptive filter generates a modified Volterra series and is connected to a third summing node. The third summing node is also connected to the second summing node and generates an error signal which is fed back to the adaptive filter. A variety of adaptive filters may be employed. In one illustrative embodiment, the adaptive filter uses a least mean square algorithm. In another illustrative embodiment, the adaptive filter uses the Kalman algorithm. In another embodiment, the invention includes testing of an integrated circuit by providing a signal input to the integrated circuit; comparing the output of the integrated circuit to a Volterra series provided by an adaptive filter, thereby generating an error signal; providing the error signal to the adaptive filter, thereby modifying the Volterra series; and using the two modified Volterra series to determine the SNR and THD of the integrated circuit.

DETAIL DESCRIPTION

Figure 1:
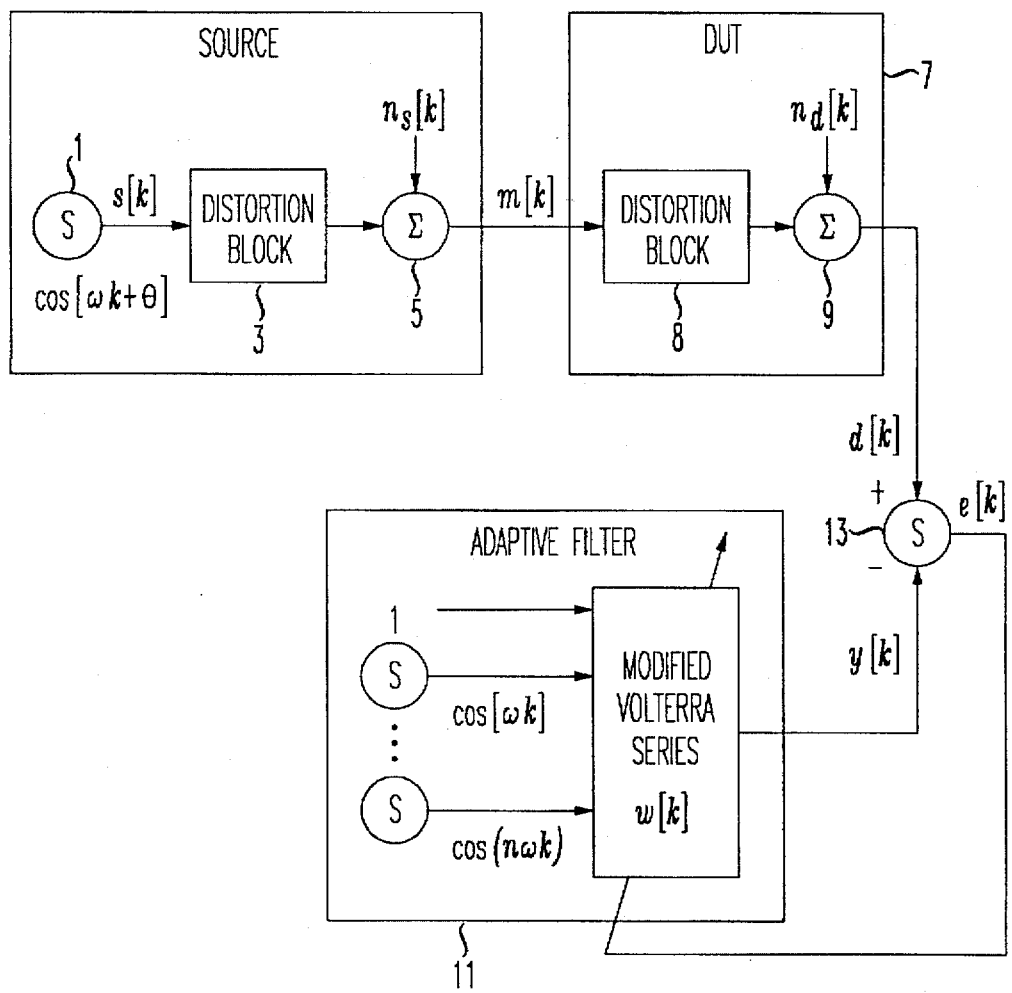
FIG. 1 is a schematic depiction of test apparatus according to this invention.

An aspect of the invention will be described by reference to the exemplary embodiment of test apparatus schematically depicted in FIG. 1. Another aspect of the invention will then be described by reference to an exemplary method. Depicted in FIG. 1 are test signal source 1, distortion block 3, first summing node 5, device under test 7, and second summing node 9. Adaptive filter 11 is connected to third summing node 13 as is the second summing node 9.

Source 1 produces an ideal signal. In practice, the ideal signal has some distortion, indicated by block 3, as well as some noise which is added by first summing node 5. The output from node 5 goes to the device under test 7 which also, as is well known, generates some distortion 8 and adds some noise. The output of the device under test 7 is then compared, at third summing node 13, with the output of adaptive filter 11. The difference between the two outputs defines the residual error which is fed back to filter 11 where it is used to update the coefficients of the Volterra series. When the coefficients have converged, they are then used to calculate the SNR and THD of the device under test 7.

Details of the device under test, typically an analog or mixed signal integrated circuit, need not be known to calculate the SNR and THD. The device under test is modeled with the simplified Volterra series which is well known to those skilled in the art. See, for example, IEEE Transaction on Automatic Control, pp. 322–327, 1967 (which is incorporated by reference) for a description of the discrete Volterra series. This paper describes the use of the Volterra series for modeling nonlinear systems. Note the caveat on page 327 that there may be no convergence of the series for some systems. The adaptive Volterra series is a linear combination of nonlinear terms. The weights or coefficients are updated with an adaptive algorithm. After the coefficients have converged, they are used to determine the amplitudes and phases of the fundamental frequency and the harmonics. The residual error is used to compute the noise power. Both the THD and SNR can then be calculated. The adaptive algorithm may be the least mean square (LMS) algorithm; this algorithm exhibits computational simplicity and there exists well developed analysis of its performance.

However, more advanced algorithms may also be used, such as Kalman algorithm. These algorithms converge more rapidly than does the least mean square algorithm, but is computationally more complex. Individual applications will determine which algorithm is selected depending upon the trade off between the desires for speed and the avoidance of computational complexity. However, as computing costs continue to decline, it is believed that the Kalman algorithm will ultimately be preferred.

Figure 2:
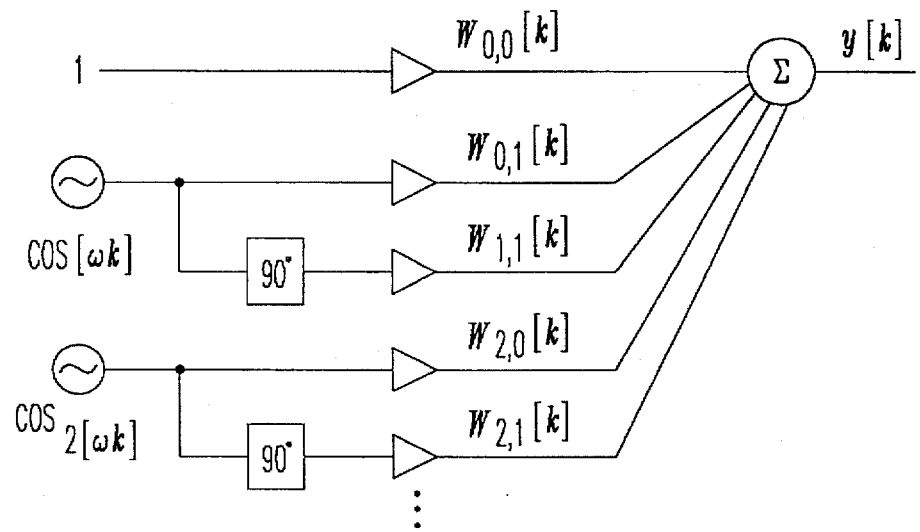
FIG. 2 is a block diagram of the modified Volterra series used in this invention.

FIG. 2 is a block diagram of the modified Volterra series. The diagram illustrates the modified Volterra series as it is applied to the third summing node. The coefficients are represented by $w_{ij}$.

The following analysis shows in greater detail the application of the Volterra series to determination of SNR and THD (see APPENDIX A below).

The adaptive Volterra series (4) considers a linear combination of non-linear terms, which is shown in equation (1) below.

The Volterra kernels at time k are given by $h[k]$, $h_i[k]$, $h_{i1,i2}[k]$, .... The length of the data sequence used by the series is N. The cumbersome part of the computation is the generation of the nonlinear terms. However, some of the combinations of delayed inputs and their cross-products used for the particular computation can be simplified in the application to SNR and THD tests, since a single-tone signal with fixed frequency and amplitude is considered. Therefore, equation (1) can be simplified to equation (2).

Considering our test case, let us define the normalized frequency $\omega$ as by equation (3), where $f_r$ is the frequency of the test signal and $f_s$ is the sampling rate. Substituting $x[k]=\cos(\omega+\theta)$ into equation (2), results in equation (4).

Using the trigonometric table, equation (4) is expanded to equation (5).

Based upon equation (5), with further expansion and rearranging the coefficients with $w_{ij}$, the output of the adaptive Volterra series can be written as equation (6).

It is observed that the quadratic form of equation (6) is needed to restore the unknown phase, $\theta$, of the source. FIG. 2 shows the structure of equation (6). This structure is similar to the work describing the relations between the LMS algorithm and the DFT in B. D. Widrow, etc., "Fundamental Relations Between the LMS Algorithm and the DFT," IEEE Trans. on Circuits and Systems, July 1987, which is incorporated by reference. The result in B. D. Widrow et al. is a special case of the adaptive Volterra series when the system is memoryless.

The weights or coefficients in equation (6), $w_{ij}$, are to be updated with adaptive algorithms. After the adaptive Volterra series has converged, these weights are used to determine the amplitudes and the phases of the fundamental frequency and the harmonics. The residual error, e, is used to compute noise power. SNR and THD can be then calculated with these results.

The LMS algorithm is chosen because of its computational simplicity and its well developed analysis of the performance, see S. Haykin, *Adaptive Filter Theory*, Prentice Hall 1986, J. R. Treichler, C. R. Johnston, and M. G. Larimore, *Theory and Design of Adaptive Filters*, John Wiley & Sons, 1987 and B. Widrow, and S. D. Stearns, Adaptive Signal Processing, Prentice Hall, 1985 which are incorporated by reference. It is a stochastic gradient estimation of the mean-square error surface. The weights of the Volterra series are updated after each new data sample. Corrections are computed as a small step in the negative direction of the instantaneous partial derivative of $e^2[k]$ with respect to the weights, where $e[k]$, the residual error, is the difference between the output of the nonlinear system to be identified, $d[k]$, and the output of the adaptive Volterra series, $y[k]$. In the vector form, equation 6 can be expressed as equations (7), (8), and (9).

The instantaneous error $e[k]=d[k]-y[k]$ is used to update the weight coefficients using the LMS algorithm with equation (10)

The four main factors affect the performance of the LMS algorithm:

the input correlation matrix $R=E$, the length of the series N, the initial condition of the weights, and the adaptation step size $\mu$.

For our application, the series length is $N=2M+1$, where M is the order of the nonlinearity of the unknown system to be identified. The correlation matrix is $R \approx I/2$, based upon the input vector in (8). The step size $\mu$, is usually determined by the input power. The larger of $\mu$ is, the faster the filter converges at the cost of a larger mean-square error at the point of convergence and at the risk of divergence. The step size, $\mu$, can be determined by trial and error in the characterization phase and is fixed in the production. The initial weights can be set to nominal values to speed up the convergence and improve the accuracy.

The proposed methodology for calculation of THD and SNR can be further improved by selecting different adaptive algorithms. One such algorithm is the Kalman algorithm, which leads to the minimization of the trace of the filtered state-error correlation matrix $K[k]$ (refer to S. Haykin, *Adaptive Filter Theory*, Prentice Hall, 1986 for explanation and derivation which is incorporated by reference). In other words, the Kalman algorithm is the linear minimum variance estimate of the state vector. By applying the Kalman algorithm to simplified Volterra series (2), we obtain equation (11).

Where $g[k]$ is the Kalman gain vector (again refer to S. Haykin, *Adaptive Filter Theory*, Prentice Hall, 1986 which is incorporated by reference for explanation and derivation). The Kalman algorithm out-performs the LMS significantly in both convergence rate and accuracy at the cost of computation complexity.

The SNR and THD are ultimately given by equations (12) and (13).

Table 1 compares the SNR and THD test results for two 10 bit analog to digital converters using the FFT method and the method of this invention. A sampling frequency of 32 kHz and a test frequency of 1.19375 kHz were used. A DSP engine was programmed to provide the real time computation for this coefficient adaptation. The test time was significantly shorter for the method of this invention, as compared to the FFT method, due to shorter data acquisition time and virtually no additional time required for computation.

TABLE 1

Comparison of FFT results with coherent and non-coherent LMS results
(30 measurements on single device)

| | | | LMS | | | | | |
|---|---|---|---|---|---|---|---|---|
| | FFT | | Coherent | | Non-coherent | | Repeated 64 points | |
| Parameter | Mean | Std. Dev. | Mean | Std. Dev. | Mean | Std. Dev. | Mean | Std. Dev. |
| THD | −55.373 | 0.193 | −55.373 | .0196 | −55.395 | 0.232 | −55.384 | 0.198 |
| SNR | −58.462 | 0.168 | −58.462 | 0.171 | −58.287 | 0.374 | −58.320 | 0.294 |

It will be appreciated from the preceding description that this invention overcomes the drawbacks evidenced by the FFT. In particular, processing can proceed as data is collected; criteria specifying sampling rate and the number of data points are relaxed, and a local oscillator that is not synchronized to the source may be used. The teachings of *Total Harmonic Distortion Measurement Using the Simplified Volterra Series with LMS Adaptive Algorithm*, Luke S. L. Hsieh and Sally L. Wood and *THD and SNR Tests Using the Simplified Volterra Series with Adaptive Algorithms*, Luke S. L. Hsieh and Andrew Grochowski are hereby incorporated by reference.

Variations in the embodiment described will be readily apparent to those skilled in the art.

Compared to previously used FFT methods, the present method has the following advantages: it is more flexible; more accurate; requires less test time; is not restricted to fixed data points; is not restricted to coherent systems; it provides real time processing; and it is easily adapted in digit testing.

$$y[k] = h[k] + \qquad\qquad 1)$$

$$\sum_{l=0}^{N-1} h_1[k]x[k-l] + \sum_{l_1=0}^{N-1}\sum_{l_2=0}^{N-1} h_{l_1,l_2}[k]x[k-l_1]x[k-l_2] + \ldots$$

$$y[k] = h[k] + h_0 x[k] + h_{0,0}[k]x^2[k] + \ldots + h_{0,\ldots,0}[k]x^M[k] \qquad 2)$$

where M is the number of harmonics $$W = 2\pi \frac{ft}{fs} \qquad\qquad 3)$$

$$d[k] = h[k] + h_0[k]\cos(\omega k + \theta) + \qquad\qquad 4)$$

$$h_{0,0}[k](\cos(\omega k + \theta))^2 + \ldots + h_{0,\ldots,0}[k](\cos(\omega k + \theta))^M$$

$$d[k] = \left( h[k] + \frac{1}{2} h_{0,0}[k] + \ldots \right) + \qquad\qquad 5)$$

$$\left( h_0[k] + \frac{3}{4} h_{0,0,0}[k] + \ldots \right) \cos(\omega k + \theta) +$$

$$\left( \frac{1}{2} h_{0,0}[k] + \ldots \right) \cos 2(\omega k + \theta) + \ldots + (\ldots)\cos M(\omega k + \theta)$$

$$y[k] = w_{0,0}[k] + w_{1,0}[k]\cos(\omega k) + w_{1,1}\sin(\omega k) + w_{2,0}[k]\cos 2(\omega k) + \qquad 6)$$

$$w_{2,1}\sin(\omega k) + \ldots + w_{M,0}[k]\cos M(\omega k) + w_{M,1}[k]\sin M(\omega k)$$

$$y[k] = \underline{w}^T[k]\underline{x}[k] \qquad\qquad 7)$$

$$\underline{x}[k] = [1\ \cos(\omega k)\sin(\omega k) \ldots \cos M(\omega k)\sin M(\omega k)]^T \qquad 8)$$

$$\underline{w}[k] = [w_{0,0}[k]w_{1,0}[k]w_{1,1}[k] \ldots w_{M,0}[k]w_{M,1}[k]]^T \qquad 9)$$

$$\underline{w}[k+1] = \underline{w}[k] + \mu e[k]\underline{x}[k] \qquad 10)$$

$$\underline{w}[k+1] = \underline{w}[k] + g[k]e[k] \qquad 11)$$

$$THD = 10\log \frac{\sum_{i=2}^{M}(w_{i,0}^2 + w_{i,1}^2)}{w_{1,0}^2 + w_{1,1}^2} \qquad 12)$$

$$SNR = 10\log \frac{\frac{1}{N}\sum_{i=1}^{N} e^2[k]}{(w_{1,0}^2 + w_{1,1}^2)/2} \qquad 13)$$

where N is the number of data points after the coefficients have converged.

The invention claimed is:

1. A method of testing an integrated circuit comprising;

providing a signal input to said integrated circuit;

comparing the output of said integrated circuit to a Volterra series provided by an adaptive filter, thereby generating an error signal;

providing said error signal to said adaptive filter, thereby modifying said Volterra series;

using said modified Volterra series to determine the SNR of said integrated circuit.

2. The method of claim 1 further including using a least mean square process to modify said Volterra series.

3. The method of claim 1 further including using a Kalman process to modify said Volterra series.

* * * * *